United States Patent
Cai

(10) Patent No.: US 8,912,598 B2
(45) Date of Patent: Dec. 16, 2014

(54) STEPPED-SOURCE LDMOS ARCHITECTURE

(71) Applicant: Fairchild Semiconductor Corporation, San Jose, CA (US)

(72) Inventor: Jun Cai, Scarborough, ME (US)

(73) Assignee: Fairchild Semiconductor Corporation, San Jose, CA (US)

(*) Notice: Subject to any disclaimer, the term of this patent is extended or adjusted under 35 U.S.C. 154(b) by 159 days.

(21) Appl. No.: 13/751,909

(22) Filed: Jan. 28, 2013

(65) Prior Publication Data

US 2013/0207186 A1 Aug. 15, 2013

Related U.S. Application Data

(63) Continuation of application No. 12/629,362, filed on Dec. 2, 2009, now Pat. No. 8,362,557.

(51) Int. Cl.
*H01L 29/66* (2006.01)

(52) U.S. Cl.
USPC .......................................................... 257/339

(58) Field of Classification Search
USPC .......................................................... 257/339
See application file for complete search history.

(56) References Cited

U.S. PATENT DOCUMENTS

| | | | |
|---|---|---|---|
| 5,517,046 A | 5/1996 | Hsing et al. | |
| 6,236,084 B1 | 5/2001 | Harada et al. | |
| 6,252,278 B1 | 6/2001 | Hsing | |
| 6,800,903 B2 | 10/2004 | Rumennik et al. | |
| 6,979,875 B2 | 12/2005 | Kwon et al. | |
| 7,626,233 B2 | 12/2009 | Tornblad et al. | |
| 8,362,557 B2 | 1/2013 | Cai | |
| 2005/0139858 A1 | 6/2005 | Sung | |
| 2011/0127607 A1 | 6/2011 | Cai | |

OTHER PUBLICATIONS

"U.S. Appl. No. 12/629,362, Notice of Allowance mailedSep. 24, 2012", 8 pgs.
Barkhordarian, Vrej, "Power MOSFET Basics", Application Note AN-1084, International Rectifier, [Online]. Retrieved from the Internet: <URL: http://www.irf.com/technical-info/appnotes/an-1084.pdf>, (Updated), 13 pgs.
Ma, Yutao, et al., "Introduction to Cadence LDMOS Model", Cadence [ppt], (Dec. 2005), 18 pgs.
Pritiskutch, John, et al., "Understanding LDMOS Device Fundamentals", Application Note AN1226, (Jul. 2000), 4 pgs.

*Primary Examiner* — Anthony Ho
(74) *Attorney, Agent, or Firm* — Schwegman Lundberg & Woessner, P.A.

(57) ABSTRACT

A semiconductor device can include a source region near a working top surface of a semiconductor region. The device can also include a gate located above the working top surface and located laterally between the source and a drain region. The source region and the gate can at least partially laterally overlap a body region near the working top surface. The source region can include a first portion having the first conductivity type, a second portion having a second conductivity type, and a third portion having the second conductivity type. The second portion can be located laterally between the first and third portions and can penetrate into the semiconductor region to a greater depth than the third portion but no more than the first portion. The lateral location of the third portion can be determined at least in part using the lateral location of the gate.

20 Claims, 7 Drawing Sheets

STEPPED-SOURCE LDMOS ARCHITECTURE

CLAIM OF PRIORITY

This application is a continuation of and claims the benefit of priority under 35 U.S.C. §120 to U.S. patent application Ser. No. 12/629,362, filed on Dec. 2, 2009, and issued as U.S. Pat. No. 8,362,557 on Jan. 29, 2013, which is incorporated by reference herein in its entirety.

BACKGROUND

Metal-oxide-semiconductor field-effect transistors (MOSFETs) can be used to amplify or switch electrical or electronic signals. MOSFETs have almost entirely displaced various other switching and amplification devices due to their low unit cost and ease of fabrication, particularly for digital switching applications. A MOSFET can include a metal or polycrystalline silicon (polysilicon) gate separated from a semiconductor region by an insulator, so the term "MOSFET" can refer generally to a FET including a metallic or a non-metallic gate material. The semiconductor region generally includes a substrate of a first conductivity type, and a source region and drain region of a second different conductivity type located on either side of the semiconductor region, under the insulator.

MOSFET devices can be categorized as n-channel or p-channel devices, and as enhancement-mode or depletion-mode devices. The enhancement-mode MOSFET includes a drain region and a source region isolated by the substrate. In the enhancement MOSFET, as voltage is applied to the gate, a channel forms on the surface of the semiconductor region between the drain and the source, allowing current to flow between the source and the drain.

In contrast, the depletion-mode MOSFET includes a coupled source and drain region extending below the gate. Here, as voltage is applied to the gate, a depletion region forms under the insulator, narrowing the coupled region between the source and the drain, the narrowed region reducing the ability for current to flow between the source and the drain.

The terms "n-channel" and "p-channel" refer to the type of charge carrier providing conduction between the source and drain regions. An "n-channel" or "NMOS" device uses majority conduction via electrons when the device is biased into conduction. Similarly, "p-channel" or "PMOS" refer to conduction via the migration of "holes." Unlike bipolar junction transistors (BJTs), MOSFETs use majority carriers primarily.

Different types of MOSFET devices can be co-integrated on a single monolithic substrate, such as by fabricating one or more wells of a first conductivity type (e.g., n type) within a substrate of the opposite conductivity type (e.g., p type). Such integrated combinations are called complimentary metal-oxide-semiconductor (CMOS) integrated circuits.

CMOS integrated circuits are usually more cost effective to manufacture as compared to bipolar technology. Also, CMOS integrated circuits can be planar, including processing primarily involving one surface of a substrate or wafer. Such planar processing can include, for example, ion implantation, diffusion, deposition, oxidation, epitaxy, one or more photolithographic techniques, or one or more other process steps. Multiple MOSFETs, among other devices such as MOS capacitors or resistors, can be fabricated and interconnected on a single monolithic substrate. Such integrated assemblies can include anywhere from a handful of devices to beyond hundreds of millions of individual devices.

Overview

A semiconductor device, such as a Lateral Diffused Metal Oxide Semiconductor (LDMOS) device, can include a source region near a working top surface of a semiconductor region. The device can also include a gate located above the working top surface and located laterally between the source and a drain region. The source region and the gate can at least partially laterally overlap a body region near the working top surface. The source region can include a first portion having the first conductivity type, a second portion having a second conductivity type, and a third portion having the second conductivity type. The second portion can be located laterally between the first and third portions and can penetrate into the semiconductor region to a greater depth than the third portion but no more than the first portion. The lateral location of the third portion can be determined at least in part using the lateral location of the gate.

Example 1 includes a semiconductor device. In this example, the semiconductor device includes a source region near a working top surface of a semiconductor region, a drain region near the working top surface and laterally offset from the source region, a gate located above the working top surface and located laterally between the source and drain regions. In this example, the source region and the gate at least partially laterally overlap a body region near the working top surface. In this example, the semiconductor region comprises a first conductivity type having a first doping profile, and the body region comprises the first conductivity type having a second doping profile. In this example, the source region comprises a first portion having the first conductivity type having a third doping profile, a second portion having a second conductivity type having a fourth doping profile, and a third portion having the second conductivity type having a fifth doping profile, and the second portion is located laterally between the first and third portions and penetrates into the semiconductor region to a greater depth than the third portion but no more than the first portion. In this example, the lateral location of the third portion is determined at least in part using the lateral location of the gate.

In Example 2, the semiconductor region of Example 1 optionally includes a semiconductor substrate.

In Example 3, the first conductivity type of any one or more of Examples 1-2 is optionally n type and the second conductivity type is optionally p type.

In Example 4, the fourth doping profile of any one or more of Examples 1-3 optionally corresponds to the fifth doping profile.

In Example 5, the semiconductor device of any one or more of Examples 1-4 optionally includes a third doping profile peak concentration that is greater than a second doping profile peak concentration.

In Example 6, the semiconductor device of any one or more of Examples 1-5 optionally includes a third doping profile that is more highly doped with respect to the first doping profile and the second doping profile.

In Example 7, the gate of any one or more of Examples 1-6 optionally includes a polysilicon portion and a first oxide spacer at the lateral edge of the gate near the source region, and the lateral location of the third portion of the source region is optionally determined at least in part using the lateral location of the first oxide spacer.

In Example 8, the semiconductor device of Example 7, optionally includes a channel length of the gate along the working top surface determined at least in part by the width of the first oxide spacer and the lateral location of the third portion of the source region.

In Example 9, the semiconductor device of any one or more of Examples 7-8 includes a width of the polysilicon portion optionally including a tapered portion, the width of the polysilicon portion narrower near the working top surface of the semiconductor region.

In Example 10, the gate of any one or more of Examples 7-9 optionally includes a second oxide spacer extending laterally from the first oxide spacer, and the lateral location of the second portion of the source region is optionally determined at least in part using the lateral location of the second oxide spacer.

In Example 11, the semiconductor device of Example 10 optionally includes a gate-to-source capacitance (Cgs) controlled at least in part using a lateral thickness of at least one of the first or second oxide spacers.

In Example 12, the semiconductor device of any one or more of Examples 10-11 optionally includes a first silicide region above the first and second portions of the source region, and a second silicide region on top of the gate, the lateral location of the first silicide region determined at least in part using the second oxide spacer.

In Example 13, the semiconductor device of any one or more of Examples 1-12 optionally includes a semiconductor region comprising a well region having the first conductivity type within a semiconductor substrate having the second conductivity type.

In Example 14, the body region of any one or more of Examples 1-13 optionally at least partially surrounds the first, second, and third portions of the source region.

In Example 15, the body region of Example 14 optionally penetrates into the semiconductor region to a depth greater than the first, second, and third portions of the source region.

In Example 16, the semiconductor device of any one or more of claims 1-15, optionally includes a drift region located laterally between the gate and the drain region and at least partially overlapping with the gate and drain regions, the drift region optionally including the second conductivity type.

In Example 17, the drain region of Example 16 optionally includes the second conductivity type having a sixth doping profile, and a peak doping concentration of the sixth doping profile is optionally greater than a peak doping concentration of a drift region doping profile.

In Example 18, the drift region of any one or more of Examples 16-17 optionally includes a shallow portion including the second conductivity type having a peak doping concentration greater than an average drift region doping concentration, the shallow portion optionally extends laterally from the drain region toward the gate.

In Example 19, the gate of Example 18 optionally includes a polysilicon portion and a first oxide spacer at the lateral edge of the gate, the lateral location of an upper portion of the shallow portion of the drift region near the first oxide spacer optionally determined at least in part by the location of the first oxide spacer, and the shallow portion optionally including a lower portion extending further under the lateral edge of the gate than the upper portion.

In Example 20, the semiconductor device of Example 19, optionally includes a difference between the lateral position of the upper and lower portions of the shallow portion of the drift region determined at least in part by boron segregation and configured to increase a drain-to-source breakdown voltage when the semiconductor device is in an off-state.

In Example 21, the drift region of any one or more of Examples 18-20, optionally includes a deep portion located at a greater depth within the semiconductor region than the shallow region, the deep portion including the second conductivity type having a peak doping concentration less than the average drift region doping concentration, the deep portion optionally extending laterally from the drain region toward the gate but not as far as the shallow portion, and the shallow and deep portions are optionally vertically separated along at least a portion of their overlapping width by a region of the first conductivity type in the lateral region extending from the gate toward the drain region.

Process Examples

Example 22 includes a method of forming a semiconductor device. In this example, the method includes forming a source region near a working top surface of a semiconductor region, forming a drain region near the working top surface and laterally offset from the source region, forming a gate located above the working top surface and located laterally between the source and drain regions. The method includes at least partially overlapping a body region near the top working surface using the source region and the gate. The method includes forming a semiconductor region having a first conductivity type and a first doping profile, and forming a body region having the first conductivity type and a second doping profile. The forming the source region includes forming a first portion having the first conductivity type and a third doping profile, a second portion having a second conductivity type and a fourth doping profile, and a third portion having the second conductivity type and a fifth doping profile. The forming the second portion includes locating the second portion laterally between the first and third portions and penetrating the second portion into the semiconductor region to a greater depth than the third portion but no more than the first portion. The forming the third portion includes locating the third portion at least in part using the later location of the gate.

In Example 23, the forming the gate of Example 22 optionally includes forming a first oxide spacer at the later edge of the gate near the source region, and the forming third portion includes locating the third portion at least in part using the lateral location of the first oxide spacer.

In Example 24, the forming the gate of Example 23 optionally includes controlling a channel length of the gate along the working top surface of the semiconductor device using the width of the first oxide spacer and the lateral location of the third portion of the source region.

In Example 25, the method of any one or more of Examples 23-24 optionally includes forming a second oxide spacer extending laterally from the first oxide spacer, and the forming the second portion of the source region optionally includes locating the second portion using the lateral location of a second oxide spacer.

In Example 26, the method of Example 25 optionally includes controlling a gate-to-source capacitance of the semiconductor device at least in part using a lateral thickness of at least one of the first or second oxide spacers.

In Example 27, the method of any one or more of Examples 25-26 optionally includes forming a first silicide region above the first and second portions of the source region, forming a second silicide region on top of the gate, and the forming the first silicide region includes locating the first silicide region laterally using the second oxide spacer.

In Example 28, the method of any one or more of Examples 22-27 optionally includes forming a semiconductor region including a well region having the first conductivity type within a semiconductor substrate having the second conductivity type.

In Example 29, the forming the body region of any one or more of Examples 22-28 optionally includes partially surrounding the first, second, and third portions of the source region using the body region.

In Example 30, the forming the body region of any one or more of Examples 22-29 optionally includes penetrating the body region into the semiconductor region to a depth greater than the first, second, and third portions of the source region.

In Example 31, the forming the drift region of any one or more of Examples 22-30 optionally includes forming the drift region having a second conductivity type, locating the drift region laterally between the gate and the drain region, and at least partially overlapping the drift region with the gate and drain regions.

In Example 32, the forming the drift region of any one or more of Examples 22-31 optionally includes forming a shallow portion of the drift region including the second conductivity type having a peak doping concentration greater than an average drift region doping concentration, and locating the drift region laterally extending from the drain region toward the gate.

In Example 33, the method of any one or more of Examples 22-32 optionally includes forming a first oxide spacer at the lateral edge of the gate, the forming the drift region optionally includes locating an upper portion of the shallow portion of the drift region near the first oxide spacer at least in part using the lateral location of the first oxide spacer, and the forming the drift region includes forming a lower portion of the shallow portion extending further under the lateral edge of the gate than the upper portion.

In Example 34, the forming the drift region of any one or more of examples 31-33 optionally includes forming a deep portion including the second conductivity type having a peak doping concentration less than the average drift region doping concentration, locating the deep portion at a greater depth within the semiconductor region than the shallow region, extending the deep portion laterally from the drain region toward the gate but not as far as the shallow portion, and vertically separating the shallow and deep portions along at least a portion of their overlapping width by a region of the first conductivity type in the lateral region extending from the gate toward the drain region.

Drift Region Architecture Examples

Example 35 includes a semiconductor device. In this example, the semiconductor device includes a semiconductor region comprising a first conductivity type having a first doping profile, a source region near a working top surface of the semiconductor region, a drain region near the working top surface and laterally offset from the source region, a gate located above the working top surface and located laterally between the source and drain regions, and a drift region located laterally between the gate and the drain region and at least partially overlapping with the gate and drain regions. The drift region of this example includes a shallow portion extending laterally from the drain region toward the gate, the shallow portion comprising the second conductivity type having a peak doping concentration greater than an average drift region doping concentration, and a deep portion located at a greater depth within the semiconductor region than the shallow region, the deep portion comprising the second conductivity type having a peak doping concentration less than the average drift region doping concentration. In this example, the deep portion extends laterally from the drain region toward the gate but not as far as the shallow portion, and the shallow and deep portions are vertically separated along at least a portion of their overlapping width by a region of the first conductivity type in the lateral region extending from the gate toward the drain region.

In Example 36, the semiconductor region of Example 35 optionally includes a semiconductor substrate.

In Example 37, the first conductivity type of any one or more of Examples 35-36 is n type, and the second conductivity type of any one or more of Examples 35-36 is p type.

In Example 38, the semiconductor device of any one or more of Examples 35-37 optionally includes a body region near the working top surface. In this example, the source region and the gate optionally at least partially laterally overlap the body region near the working top surface, and the body region comprises the first conductivity type having a second doping profile. In this example, the source region optionally includes a first portion having the first conductivity type having a third doping profile, a second portion having a second conductivity type having a fourth doping profile, and a third portion having the second conductivity type having a fifth doping profile. In this example, the second portion is optionally located laterally between the first and third portions and penetrates into the semiconductor region to a greater depth than the third portion but no more than the first portion, and the lateral location of the third portion is determined at least in part using the lateral location of the gate.

In Example 39, the fourth doping profile of Example 38 optionally corresponds to the fifth doping profile.

In Example 40, the third doping profile of any one or more of Examples 38-39 optionally includes a third doping profile peak concentration greater than a second doping profile peak concentration.

In Example 41, the third doping profile of Example 40 is optionally more highly doped with respect to the first doping profile and the second doping profile.

In Example 42, the gate of any one or more of Examples 38-41 optionally includes a polysilicon portion and a first oxide spacer at the lateral edge of the gate near the source region. In this example, the lateral location of the third portion of the source region is determined at least in part using the lateral location of the first oxide spacer.

In Example 43, the semiconductor device of Example 42 optionally includes a channel length of the gate along the working top surface that is determined at least in part by the width of the first oxide spacer and the lateral location of the third portion of the source region.

In Example 44, the polysilicon portion of any one or more of Examples 42-43 optionally includes a tapered portion and gets narrower near the working top surface of the semiconductor region.

In Example 45, the gate of any one or more of Examples 42-44 optionally includes a second oxide spacer extending laterally from the first oxide spacer, and wherein the lateral location of the second portion of the source region is determined using the lateral location of the second oxide spacer.

In Example 46, the semiconductor device of Example 45 optionally includes a gate-to-source capacitance (Cgs) is controlled at least in part using a lateral thickness of at least one of the first or second oxide spacers.

In Example 47, the semiconductor device of any one or more of Examples 11-12 optionally includes a first silicide region above the first and second portions of the source region, a second silicide region on top of the gate. In this example, the lateral location of the first silicide region is optionally determined using the second oxide spacer.

In Example 48, the body region of any one or more of Examples 38-47 optionally at least partially surrounds the first, second, and third portions of the source region.

In Example 49, the body region of Example 48 optionally penetrates into the semiconductor region to a depth greater than the first, second, and third portions.

In Example 50, the semiconductor device of any one or more of Examples 35-49 optionally includes a well region having the first conductivity type within a semiconductor substrate having the second conductivity type.

In Example 51, the drain region of any one or more of Examples 35-50 optionally includes the second conductivity type having a sixth doping profile. In this example, a peak doping concentration of the sixth doping profile is optionally greater than a peak doping concentration of a drift region doping profile.

In Example 52, the gate of any one or more of Examples 35-51 optionally includes a polysilicon portion and a first oxide spacer at the lateral edge of the gate, wherein the lateral location of an upper portion of the shallow portion of the drift region near the first oxide spacer is determined at least in part by the location of the first oxide spacer, and wherein the shallow portion includes a lower portion extending further under the lateral edge of the gate than the upper portion.

In Example 53, the semiconductor device any one or more of Examples 35-52 optionally includes a difference between the lateral position of the upper and lower portions of the shallow portion of the drift region determined at least in part by boron segregation and configured to increase a drain-to-source breakdown voltage when the semiconductor device is in an off-state.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
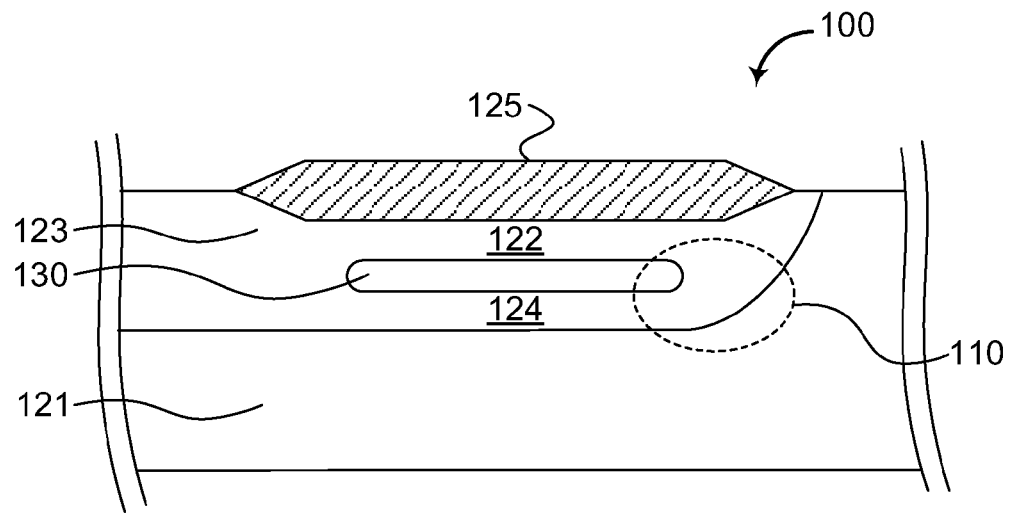
FIG. 1 illustrates generally an example of a prior art semiconductor device including a buried p type region within a drift region below a field oxide layer.

MOSFETs can be used in a variety of consumer and industrial applications, such as for switching applications. The present inventor has recognized, among other things, that certain power MOSFET devices can be fabricated using processes similar to those used for very large scale integration (VLSI) devices, such as including CMOS integrated circuits. A power MOSFET can include a laterally separated source, gate, and drain. In certain examples, a lateral power MOSFET can operate using primarily a lateral mode of conduction between the source and drain. In certain examples, the lateral conduction can be nearly parallel to a specified surface of a semiconductor substrate, such as a top working surface. Power MOSFETs, such as including the lateral configuration, can be fabricated using processing similar to low-power digital CMOS VLSI device processing, or one or more other processes.

In an example, one or more power MOSFETs can be co-integrated with one or more high speed or low power digital CMOS devices. In certain examples, the one or more co-integrated power MOSFETs and the one or more digital devices can be included as a portion of a mixed-signal system including digital, power or analog blocks. In an example, the mixed-signal system can be fabricated on a single monolithic substrate, such as using processing techniques similar to planar CMOS processing.

A manufacturing process for a lateral MOSFET semiconductor device can include one or more deposition, implant, or diffusion steps, among one or more other steps. In certain examples, one or more donor or acceptor impurities can be introduced into a semiconductor substrate via ion implantation at a specified energy level, dose (e.g., a specified ion concentration), or angle. In certain examples, such as after one or more ion implantation steps, impurities can be thermally diffused to penetrate into specified locations and to achieve a desired impurity profile, or "doping profile," within the semiconductor device.

In certain examples, a source region and a body region of a lateral MOSFET can be fabricated using a common mask or a common alignment feature, such as during one or more successive implant or thermal diffusion steps. When two or more regions are formed using successive self-aligned thermal diffusion steps such as using one or more common masks or alignment features, the lateral MOSFET semiconductor device is called a Lateral Diffused Metal Oxide Semiconductor device.

The present inventor has recognized, among other things, that an LDMOS semiconductor device can include a source region having step-like profile within a semiconductor substrate or within a well region. For example, the step-like profile can include a first portion of a first conductivity type (e.g., an n type conductivity having an "n+" doping profile), a second portion of a second conductivity type (e.g., a p type conductivity having a "p+" doping profile), and a third portion also of the second conductivity type (e.g., a p type conductivity having a "p+" doping profile).

Figure 3:
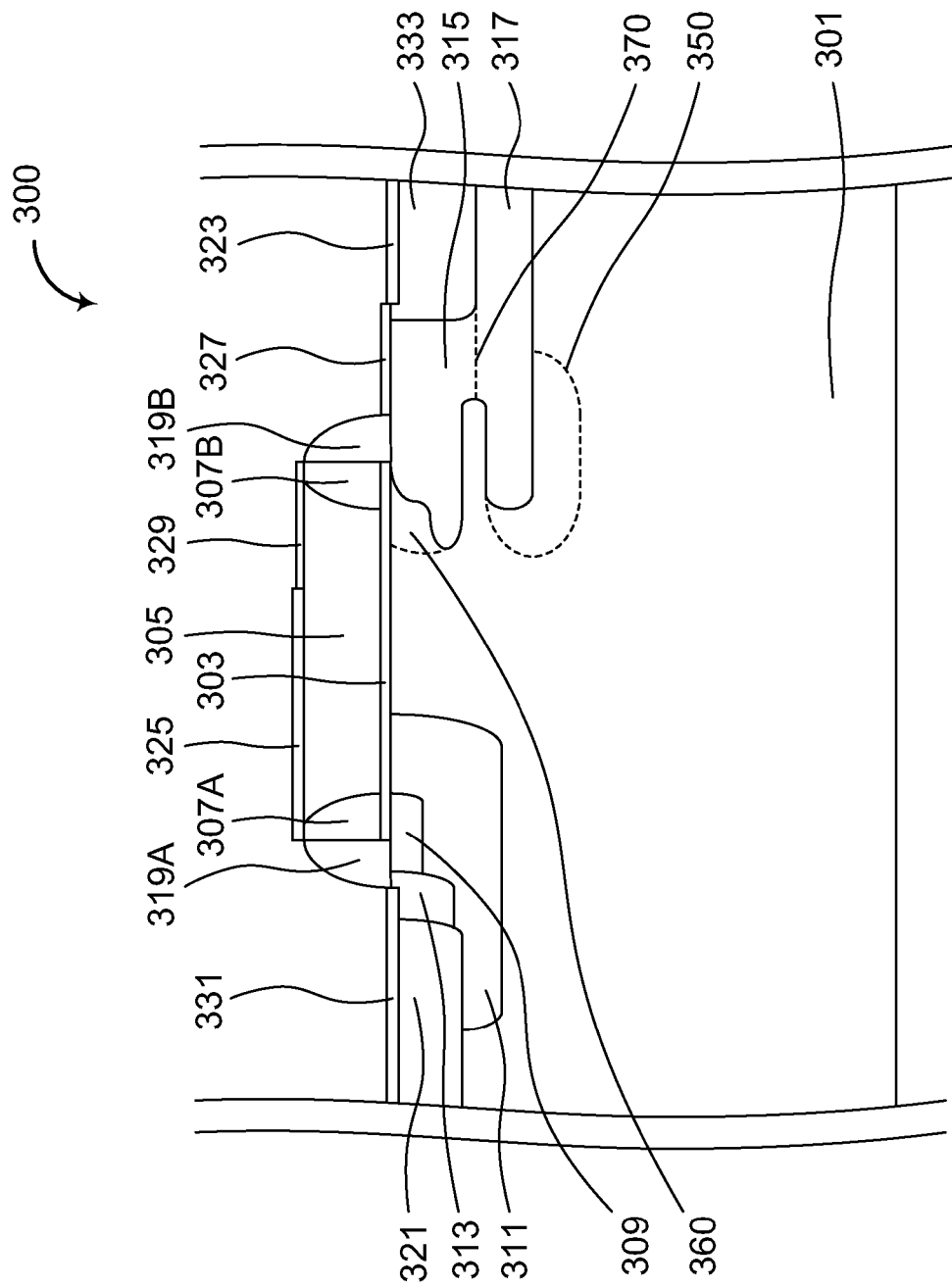
FIG. 3 illustrates generally an example of a semiconductor device including a stepped-source region and a drift region including shallow and deep portions.

The second portion can be located laterally within the semiconductor substrate or the well region, between the first and third portions, and can penetrate into the semiconductor substrate to a greater depth than the third portion, but no more than the first portion, such as shown in the example of FIG. 3. In this example, the semiconductor can include a gate located above a working top surface of the semiconductor region or well region. For example, the lateral location of the third portion can coincide with the edge of the gate, such as using one or more oxide spacers to self-align the third portion with the gate edge during one or more fabrication process steps.

The present inventor has also recognized that using a self-aligned third portion of the source region can allow more control over the size of the region where the third portion overlaps with the gate laterally. This overlapping region can thereby affect the gate-to-source capacitance (Cgs) of the semiconductor device. A reduction in the size of this overlapping region can correspondingly reduce the gate-to-source capacitance (Cgs) of the semiconductor device.

The present inventor has also recognized that a drift region of an LDMOS device can be fabricated, for example, including a shallow portion and a deep portion both having the second conductivity type (e.g., a p type conductivity). In an example, such as shown in FIG. 3, the shallow portion of the drift region can have a doping profile including a peak doping concentration greater than an average doping concentration of the drift region as a whole. In this example, the deep portion of the drift region can have a doping profile including a peak doping concentration less than the average doping concentration of the drift region as a whole.

The lateral location of the shallow portion of the drift region can coincide with the edge of the gate, such as using one or more oxide spacers to self-align an upper portion of the shallow portion with the gate edge during one or more fabrication steps. The shallow portion of the drift region can also include a lower portion extending further from the drain region toward the gate and under the lateral edge of the gate and the upper portion. For example, a pullback of the shallow portion (e.g., through migration of impurity ions) from a region immediately below the gate can affect a gate-to-drain capacitance (Cgd). In this example, a reduction in gate-to-drain capacitance (Cgd) can be realized at least in part by reducing an amount of lateral overlap between the upper portion of the shallow portion of the drift region with the gate.

FIG. 1 illustrates generally an example of an NMOS semiconductor device 100 including a substrate 121 having a p− doping profile, and a buried p type region 130 within an n well region 123 below an optional field oxide layer 125. In this example, the p type region 130 is implanted inside the n well region 123 either before or after the field oxide layer 125 is built up over the n well region 123.

The example of FIG. 1 includes several fabrication and electrical performance limitations. The field oxide layer 125, if included, must be fabricated after the n well 123. Thus, it is not possible to self-align the n well 123 to the field oxide layer 125 location using the structure of FIG. 1. Similarly, the location and boundaries of the buried p type region 130 are determined externally to the device during fabrication, such as using one or more masks, or via controlling an implant dose, energy, or angle.

In certain examples, when the field oxide layer 125 is included, the implant dose and energy used to embed the p type region within the n well 123 can be greater than when no field oxide layer 125 is included. In either case, the oxide layer 125 is not used during fabrication to align the buried p type region 130 to a desired location. Thus, an additional mask or other external aids are needed to establish the position and boundaries of the p type region 130 during fabrication. The additional mask or other external aids increase fabrication complexity and cost compared to a device having no buried regions, and compared to a device including a drift region formed self-aligned to one or more other features on the device, such as self-aligned to a gate polysilicon region.

The electrical performance of the example of FIG. 1 can be limited since there is no gap between an top portion 122 of the n well 123 and a bottom portion 124. In this example, the n well 123 can act as a drift region during device operation. In this example, the buried p type region 130 does not extend laterally all the way to the substrate 121 in the region 110, thus there is an n type region bridging the top portion 122 and the bottom portion 124 of the n well 123.

Moreover, the n well 123 depth in the region 110 can increase a likelihood of a drain-to-source punch-through and a correspondingly lower drain-source breakdown voltage as compared to a device including a separation, such as a region of p type conductivity, in the region 110 between top portion 122 and bottom portion 124 of the n well 123.

For these and other reasons the present inventor has recognized that providing a gap or separation having the opposite conductivity type (e.g., p type conductivity in the example of FIG. 1) can improve the semiconductor device performance. For example, a gap between the top portion 122 and the bottom portion 124 of the n well can both improve drain-to-source breakdown voltage and reduce a likelihood of drain-to-source punch-through as compared to the example of FIG. 1, for a device of similar or even smaller scale.

Further, the present inventor has also recognized, among other things, that separating a shallow portion of the drift region vertically from a deep portion of the drift region in the area below the gate of an LDMOS semiconductor device can increase a drain-to-source breakdown voltage, at least in part, by shifting a high electric field depletion region near the drain deeper into the substrate, and away from the source region, as shown in the example of FIG. 3.

Figure 2:
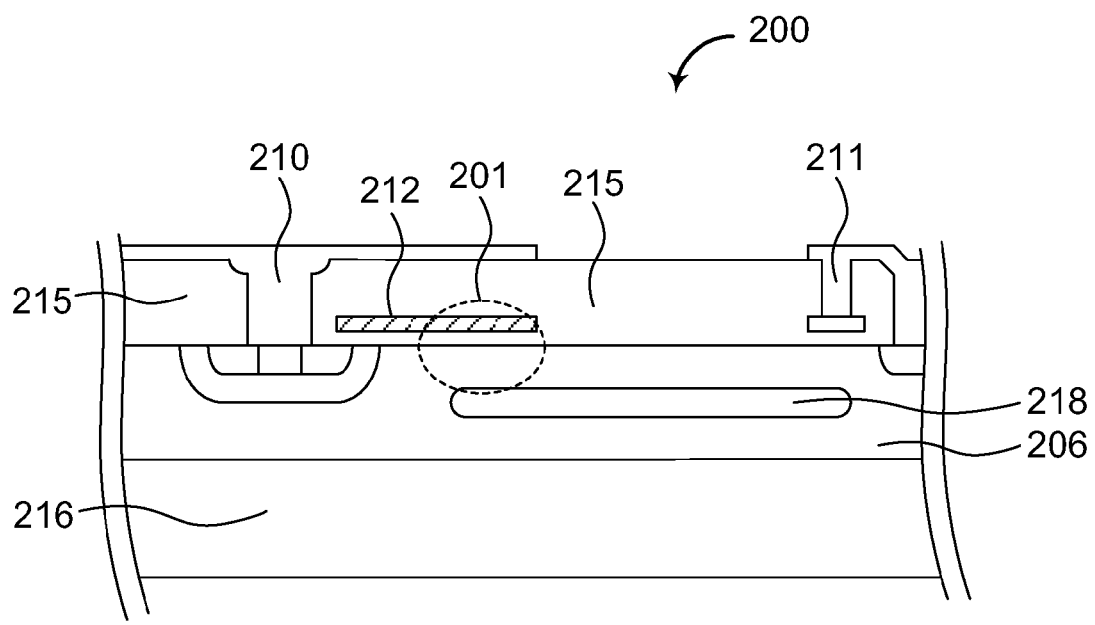
FIG. 2 illustrates generally an example of a prior art semiconductor device including a non-self-aligned drift region including a buried p type region.

FIG. 2 illustrates generally an example of an NMOS power semiconductor device 200 including an n layer 206, and including a buried p type region 218 within the n layer 206. In this example, the semiconductor device 200 includes a substrate 216 having a p− doping profile, with the n layer 206 on top of the substrate 216 acting as a drift region during device operation.

In this example, a buried gate 212 is included in a field oxide layer 215 (e.g., a "field plate" device), along with a source connection 210, and a drain connection 211. In this example, similar to the example of FIG. 1, the location of the gate 212 and the field oxide 215 are determined independently of the location of the buried p type region 218. Moreover, the n layer 206 includes a region 201 where a significant proportion of the gate area is overlapped laterally by the drift region formed by the n layer 206.

The present inventor has recognized, among other things, that using the gate 212 to determine, at least in part, the location of the drift region (e.g., n layer 206) can reduce a gate-to-drain capacitance (Cgd) while also reducing the complexity or cost of fabrication, and can permit a reduction in device area as compared to the structure shown in FIG. 2. For example, reducing the size of a laterally overlapping region, such as the region 201, where the drift region (e.g., n layer 206) laterally overlaps with the gate 212, can also reduce the gate-to-drain capacitance (Cgd).

A self-aligned drift region, such as shown in the example of FIG. 3, can eliminate the need for a buried p type region 218. In contrast, the example of FIG. 2 illustrates a drift region formed by n layer 206. Such a layer 206 must be formed prior to other device structures shown in the example of FIG. 2, such as using epitaxy, or in the case of an n well, through implantation or diffusion prior to other fabrication steps. Thus, the drift region of n layer 206 below the gate 212 of FIG. 2 is not capable of being fabricated in a self-aligning manner, such as using the gate 212 to determine the n layer 206 location, at least in part, during one or more fabrication process steps.

FIG. 3 illustrates generally an example of a section view of a semiconductor device 300, such as an LDMOS semiconductor device, including a semiconductor region 301 having a first conductivity type having a first doping profile (e.g., a weakly n doped "n-" doping profile), a body region 311 having the first conductivity type having a second doping profile (e.g., an "n-" doping profile), a source region, and a drift region including a shallow portion 315 and a deep portion 317. In this example, the semiconductor device 300 can include a source region near a working top surface of the semiconductor region 301, a drain region 333 laterally offset from the source region, and a gate 305 located above the working top surface and located laterally between the source and drain regions.

The source region can include a first portion 321 having a first conductivity type having a third doping profile (e.g., an "n+" doping profile), a second portion 313 having a second conductivity type having a fourth doping profile (e.g., a "p+" doping profile), and a third portion 309 having a second conductivity type having a fifth doping profile (e.g., a "p+" doping profile). In certain examples, such as the "stepped-source" example shown in FIG. 3, the second portion can penetrate more deeply into the semiconductor region 301 than the third portion 309, but no more than the first portion 321. In certain examples, such as shown in FIG. 3, the body region 311 can surround at least a portion of the first portion 321, the second portion 313, or the third portion 309, within the semiconductor region 301.

In the example of FIG. 3, the gate 305 can be polycrystalline silicon (polysilicon), doped the same as the first conductivity type, or one or more other materials, and can be conductively isolated from the working top surface of the semiconductor region 301 by a bottom gate oxide layer 303. One or more other portions of the semiconductor device 300 can be covered, for example, with a top gate oxide layer 329, or a drain oxide layer 327, one or more other oxide layers, or one or more passivation layers.

In certain examples, the location of the third portion 309 of the source region or the body region 311 can be coincident with the source side of the gate 305. In an example, the lateral location of the third portion 309 can be determined in part, such as during fabrication, using the first oxide spacer 307A. Similarly, in certain examples, the location of the second portion 313 of source region 331 can be coincident with a second oxide spacer 319A, located on the source side of the first oxide spacer 307A, such as using the second oxide spacer 319A at least in part to determine the location of the second portion 313.

The present inventor has recognized that the thickness of the first oxide spacer 307A or the second oxide spacer 319A on the source side of the gate 305 can affect the gate-to-source capacitance (Cgs) of the semiconductor device 300. For example, an effective channel length of the gate 305 can be determined by an amount of overlap between the third portion 309 or body region 311 with the gate 305 polysilicon, or by the amount of gate 305 polysilicon consumed by the oxide spacers 307A-B.

In certain examples, the lateral position or an amount of overlap between the third portion 309 or body region 311 and the gate 305 can be determined at least in part by a width of the first oxide spacer 307A, such as during one or more fabrication process steps. For example, the overlap between the body region 311 and the gate 305 can be used to adjust an effective channel length of the semiconductor device 300 to achieve a sub-micron (e.g., less than 1 μm) channel length, and a correspondingly small Cgs. A small Cgs can enhance high-frequency switching performance, such as compared to devices having a longer effective channel length, or a greater overlap between the gate and source regions.

In certain examples, at least one of the third portion 309 or the body region 311 are self-aligned with respect to the gate 305, such as using the first oxide spacer 307A during fabrication. In certain examples, a profile of the gate 305 polysilicon includes a tapered portion, getting narrower near the working top surface of the semiconductor region 301 (e.g., the gate 305 is narrower just above the bottom oxide layer 303). For example, the tapering can slightly reduce the effective channel length of the gate, and can further reduce the amount of overlap of the gate 305 and the third portion of the source region 309, further reducing Cgs.

Figure 7:
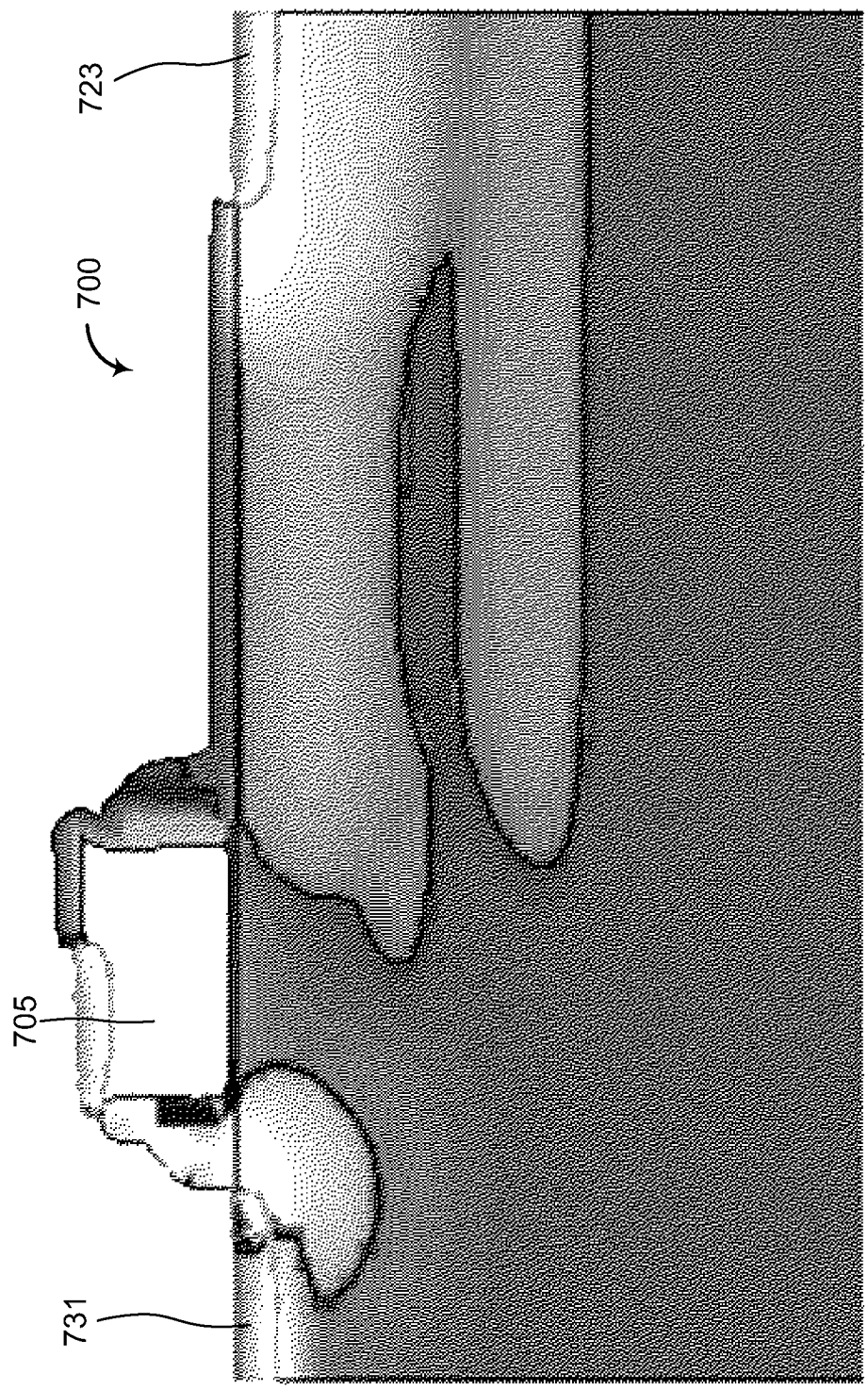
FIG. 7 illustrates generally an example of a simulation illustrating relative doping concentrations of an LDMOS device, such as the device of FIG. 3.

In an illustrative example, an LDMOS device, such as shown in the examples of FIG. 3 or 7, can be fabricated using a 0.35 μm process code. In this example, the LDMOS device can be a unit device, and can have a total source length of 0.5 μm, including the first portion 321 (e.g., an "n+" source "tap"). In this illustrative example, the first portion 321 can reduce a risk of parasitic BJT latch up during device operation, the second portion can 313 operate primarily as the device 300 source. In this illustrative example, the third portion 309 can be a source "spacer" to decrease a gate-to-source capacitance (Cgs), such as compared to a device having a second portion 313 extending under the edge of the first oxide spacer 307A.

In this illustrative example, since Cgs can be reduced using the third portion 309, the overall source region area can also be reduced without compromising device performance. For example, a reduction in Cgs, such as due to the use of the stepped-source structure (including the third portion 309 used as a "source spacer" in the illustrative example) can compensate at least in part for reducing a separation between the second portion 313 or first portion 321 and the gate 305. In this example, the semiconductor device 300 can have a higher operating frequency or can switch more rapidly between an off-state and an on-state as compared to a device having a larger area, or a device having a larger Cgs.

In certain examples, such as the example of FIG. 3, the semiconductor device 300 can include multiple portions near the drain region 333, such as a drift region including the shallow portion 315 and the deep portion 317. The shallow and deep portions, 315, 317 can include the second conductivity type (e.g., p type). In an example, the shallow portion 315 can have a peak doping concentration greater than an average drift region doping concentration. For example, the average drift region doping concentration can include the average doping concentration of the combination of shallow portion 315 and the deep portion 317.

In an example, the deep portion 317 can have a peak doping concentration less than the average drift region doping concentration. In certain examples, the drain region 333 can have a second conductivity type having a sixth doping profile, one or more other doping profiles. In an example, the sixth doping profile of the drain region 333 can have a peak doping concentration greater than the average doping concentration of the drift region including the shallow portion 315 and the deep portion 317.

In certain examples, the drain region 333 can penetrate into the semiconductor region 301, such as to provide a connection between the shallow portion 315 and the deep portion 317 of the drift regions (e.g., a "p+" "drain tap"). In certain examples, the shallow portion 315 of the drift region can extend laterally between the drain region 333 toward the gate 305, and can partially laterally overlap with the gate 305, such as shown in FIG. 3. For example, the shallow portion 315 can include an upper portion near the region 360 under the gate.

In certain examples, the lateral location of the upper portion can be coincident with a first oxide spacer 360 on the drain side of the gate 360. In an example, the lateral location of the upper portion can be determined at least in part using the lateral location of the first oxide spacer 307B, such as during fabrication. In certain examples, the upper portion can be pulled back from the region under the gate 360, such as to reduce an amount of lateral overlap between the upper portion of the shallow portion 315 and the gate 305. In an example, such as shown in FIG. 3, a gap as shown in the region under the gate 360 can be provided by segregation of impurity ions during fabrication, such as by boron segregation (e.g., for a PMOS device having a p type shallow portion 315).

In certain examples, the amount of lateral overlap of the shallow portion 315 and the gate 305 in the region 360 immediately under the gate can be used to control a gate-to-drain capacitance (Cgd). For example, the region 360 under the gate can become easily depleted and thus a parasitic feedback capacitance of the semiconductor device 300 can be reduced and linearity can be improved, such as compared to a device having a drift region including a larger laterally overlapping region under the gate, such as the device of FIG. 2.

In certain examples, such as the example of FIG. 3, the deep portion 317 of the drift region can be located at a greater depth within the semiconductor region 301 than the shallow portion. In the example of FIG. 3, the deep portion 317 extends laterally from the drain region 333 toward the gate 305, but not as far as the shallow portion 315, forming a "retrogressed drift region." In certain examples, the shallow portion 315 and the deep portion 317 can be vertically separated along a portion of a boundary 370 between the shallow portion 315 and the deep portion 317.

The present inventor has recognized, among other things, that using a relatively high doped and shallow portion 315 can reduce an on-state resistance ($R_{DSon}$) between the source and drain region 333, and can beneficially increase a drain-to-source punch-through voltage. However, if the deep portion 317 is omitted, the shallow portion 315 can induce a low avalanche junction breakdown between the shallow portion 315 and the semiconductor region 301 (e.g., between the shallow portion 315 of the drift region and the substrate or the well in which the device 300 is fabricated).

The present inventor has also recognized that using a relatively low doped retrogressed deep portion 317, such as including a separation between the shallow portion 315 and the deep portion 317, can alter the shape of the depletion region around the drift region. For example, when the device 300 is in the off-state, the vertical separation between the shallow portion 315 and the deep portion 317 can become easily depleted (e.g., in the gap near the boundary 370), further driving the depletion region into the region 350, when the drain voltage is increased. In this example, a region of peak electric field can be driven into the region 350 between the deep portion 317 and the semiconductor region 301 (e.g., between the deep portion 317 of the drift region and substrate or the well in which the device 300 is fabricated).

In certain examples, an oxide region can be reacted with a transition metal to form one or more conductive layers, such as for making electrical contact with the semiconductor device 300, including a source silicide layer 331 in the source region, a gate silicide layer 325 in contact with the gate 305 polysilicon, or a drain region silicide layer 325. In certain examples, one or more silicide layers can be coincident with one or more other device features, such as shown in the example of FIG. 3. In this example, a lateral location of the source silicide layer 331 can be coincident with the edge of the second oxide spacer 319A, such as by using the second oxide spacer 319A at least in part to align the lateral location of the source silicide layer 331 during fabrication. Similarly, in certain examples, a lateral location of the drain region silicide layer 325 can be coincident with a second oxide spacer 319B on the drain side of the gate 305.

In certain examples, a PMOS semiconductor device is described. However, the present inventor has recognized that examples within the scope of this document need not be restricted to PMOS, and can be practiced in an NMOS device.

In certain examples, complementary conductivity types can be used, such as by switching the n type regions to p type regions and vice versa in the examples presented herein. In certain examples, combinations of NMOS and PMOS devices can be used. In an example, a well of a first conductivity type (e.g., an n type well) can be formed within a substrate of a complementary second conductivity type (e.g., a p type substrate). In this example, a semiconductor device of one type (e.g., PMOS) can be fabricated in or above the well, and a complementary device (e.g., NMOS), can be fabricated elsewhere within the same substrate, along with one or more other devices.

Process Examples

Figure 4A:
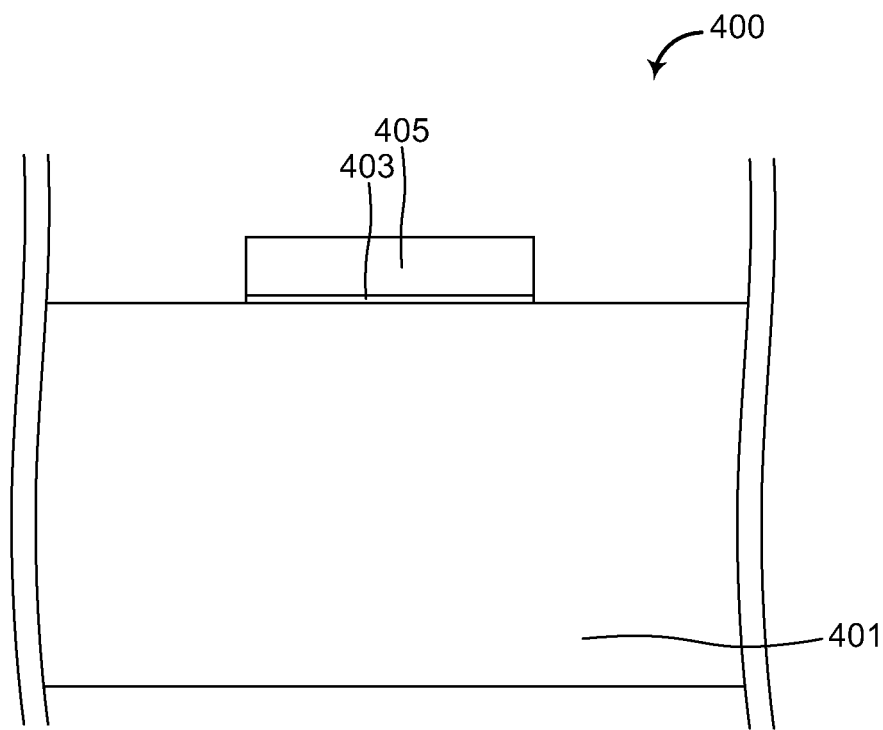
FIGS. 4A-4B; 5A-5B; and 6A-6D illustrate generally various processing techniques that can be used to form a semiconductor device including a stepped-source or a drift region including shallow and deep portions.
Figure 4B:
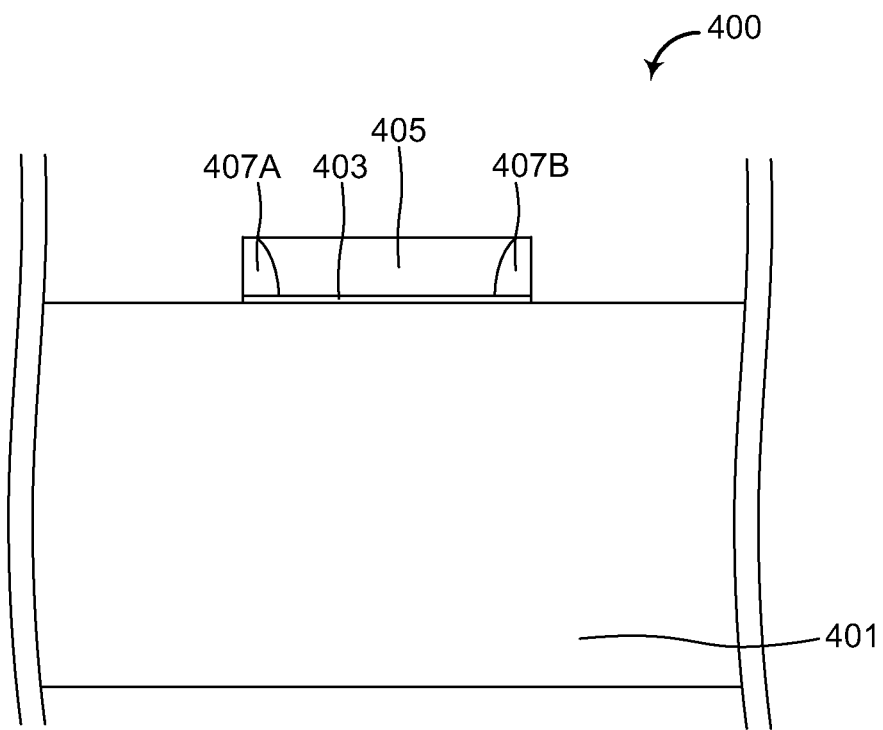

FIGS. 4A-4B show examples of process steps, such as for providing a portion of the semiconductor device 300 shown in FIG. 3, including forming an oxide layer 403 on a semiconductor region 401 of a semiconductor device 400. In certain examples, the semiconductor region 401 includes a lightly doped n type semiconductor, such as silicon doped with one or more impurities such as phosphorous or arsenic, or one or more other compounds.

In these examples, the oxide layer 403 can be silicon dioxide ($SiO_2$), grown, deposited, or reacted on the surface of the silicon semiconductor region 401, such as in the presence of heat or one or more oxidizing reagents. In certain examples, the semiconductor region 401 can be a well region, such as a lightly doped n type well region or an n type epitaxial region, formed as a portion of a larger semiconductor device 400 having a p type substrate.

In the example of FIG. 4A, a gate 405 can be formed on top of the oxide layer 403. In certain examples, a polysilicon region can be formed above the oxide layer 403, such as through deposition or growth, and a gate 405 can be patterned on the polycrystalline silicon region using one or more lithographic steps. In an example, the patterned gate 405 can then be formed, such as by etching away the surrounding polycrystalline region and oxide elsewhere.

In the example of FIG. 4B, one or more oxide spacers such as a source side oxide spacer 407A and a drain side oxide spacer 407B can be formed within the gate 405. In an example, the gate 405 can be polysilicon, and the oxide spacers 407A-B can be formed in part using thermal oxidation, converting a portion of the gate 405 from conductive polysilicon into non-conductive $SiO_2$. In certain examples, one or more of the oxide spacers 407A-B can later be used at least in part to mask or align various other portions of the device 400, such as when the one or more other portions are formed during one or more other fabrication process steps.

Figure 5A:
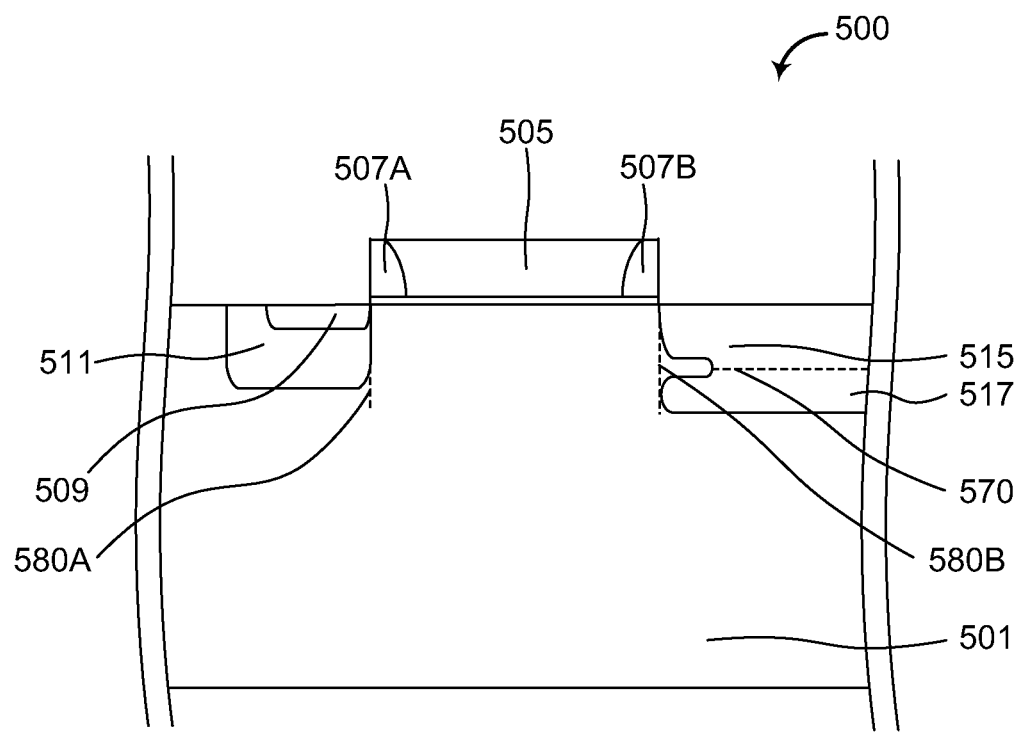
Figure 5B:
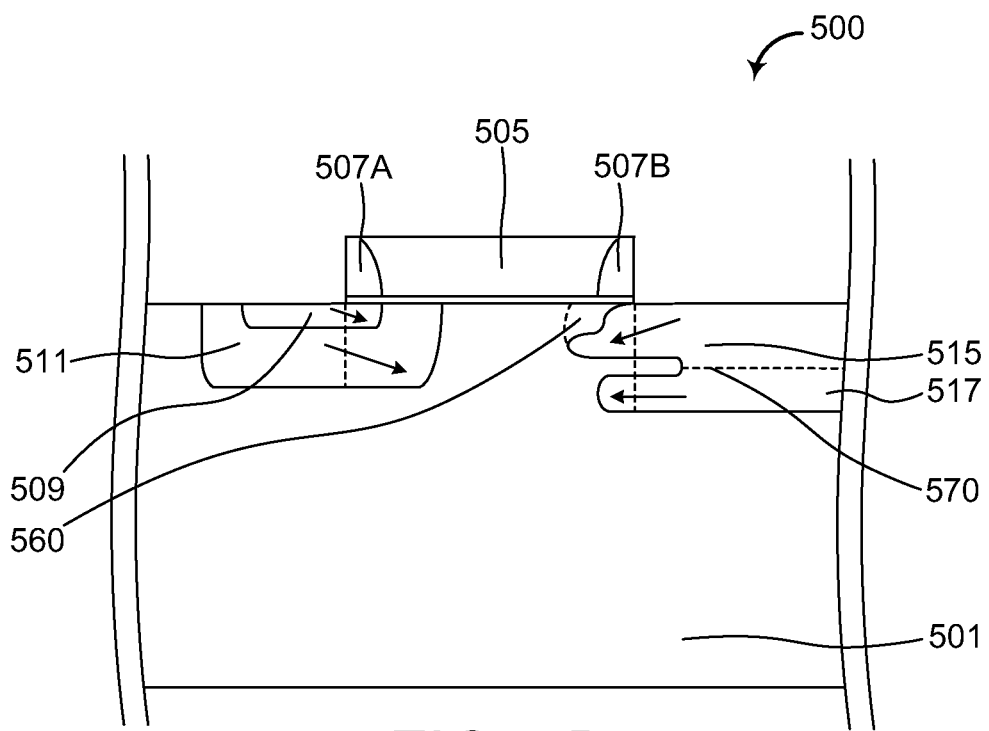

FIGS. 5A-5B show examples of process steps, such as for providing a portion of the semiconductor device 300 shown in FIG. 3. In certain examples, one or more process steps can include forming one or more implanted or diffused regions, such as forming a third portion 509 of a source region of a semiconductor device 500, forming a body region 511, and forming one or more drift regions on the drain side of the device 500, such as a shallow portion 515 or a deep portion 517 of the drift region, within a semiconductor region 501, such as a substrate or well.

In an example, the third portion 509 can have a highly doped shallow "p+" doping profile (e.g., doped with one or more acceptor impurities such as boron), and can be implanted in the semiconductor region 501 such as using ion implantation. In an example, the body region 511, can have a lightly doped n− doping profile, and can be implanted in the semiconductor region 501 such as using ion implantation. In an example, such as shown in FIG. 5A, a lateral edge 580A of the third portion 509 or the body region 511 can be coincident with the edge of an oxide spacer 507A, such as the oxide spacer 407A formed in the example of FIG. 4B, after implant.

Similarly, in an example, such as shown in FIG. 5B, a lateral edge 580B of the shallow portion 515 of the drift region or the deep portion 517 of the drift region can be coincident with the edge of an oxide spacer 507B on the drain side of the gate 505.

In an example, both the third portion 509 and the body region 511 can be implanted using the same mask or alignment features, such as using the first oxide spacer 507A, during fabrication. In certain examples, the shallow portion 515 or the deep portion 517 can be implanted using the same mask or alignment features, such as the first oxide spacer 507B, during fabrication. In certain examples, the depth or lateral position of one or more of the third portion 509, the body region 511, the shallow portion 515 or the deep portion 517 can be adjusted, such as by varying an ion implantation dose, angle, or energy level. In certain examples, one or more of the third portion 509, the body region 511, or the shallow portion 515 can at least partially overlap the underside of the gate region 505, such as, for example, when a non-orthogonal implantation angle is used during one or more ion implantation steps, or by subsequent drive-in or thermal diffusion steps. In certain examples, one or more of oxide spacers 507A-B can be used as a mask during the ion implantation to determine a lateral location, at least in part, of one or more of the third portion 509, the body region 511, the shallow portion 515, or the deep portion 517, or one or more other features.

In certain examples, one or more of the third portion 509, the body region 511, the shallow portion 515, or the deep portion 517 can be driven laterally or to a greater depth in the semiconductor region 501, such as by using one or more thermal diffusion steps. In an example, the body region 511 can be formed to extend further underneath the gate 505 in a lateral direction, and to a greater depth than the third portion 509, such as by using one or more ion species that diffuse at different rates. In an illustrative example of an NMOS semiconductor device, the body region 511 can doped with boron, and can preferentially diffuse further, faster, under the gate 505 to form the body region 511, as compared to a third portion 509 doped with, for example, arsenic, given similar thermal diffusion process conditions (e.g., similar time and temperature). In this example, the body region 511 and third portion 509 can be formed nearly simultaneously using thermal diffusion after one or more implant steps, at least in part by using the different diffusion rates of the dopants.

Similarly, in certain examples, the shallow portion 515 or the deep portion 517 of the drift region can be extended laterally further toward the gate, or deeper into the semiconductor region 501 using one or more thermal diffusion steps. In certain examples, in a region 560 immediately below the gate, an upper portion of the shallow portion 515 need not extend as far as the lower portion of the shallow portion 515.

In certain examples, the region 560 can be relatively free of the doping impurity included in the shallow portion 515. In an illustrative example of a PMOS device, the region 560 in the semiconductor region 501 can be maintained relatively free of the doping impurity of the shallow portion 515 in part using boron segregation during a thermal diffusion step. In this example, a lower portion of the shallow portion 515 can extend further underneath the gate 505 below the region 560 than the upper portion, and the upper portion can be coincident or can extend no further than the inside edge of the oxide spacer 507B adjacent the gate 505, such as shown in FIG. 5B.

In an example, the shallow portion 515 and the deep portion 517 can be thermally diffused (e.g., "driven") simultaneously, and the deep portion 517 can be formed in a retrogressed configuration, such as shown and discussed above with respect to the deep portion 317 of FIG. 3. In an example, the shallow portion 515 can diffuse more rapidly than the deeper portion 517. In an example, the deep portion 517 can be formed by a combination of implant and diffusion, including a lower dose implant of the doping impurity than the shallow portion 515, or using an implant location laterally offset from the shallow portion 515, such as followed by thermal diffusion.

Figure 6A:
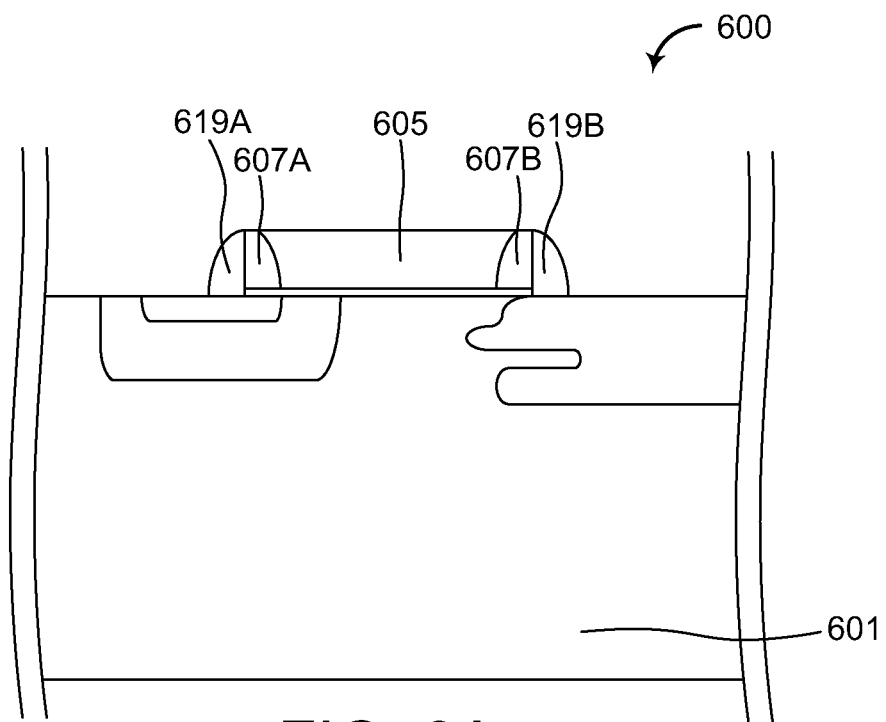

FIGS. 6A-6D show examples of process steps, such as for providing a portion of the semiconductor device 300 shown in FIG. 3. In certain examples, such as shown in FIG. 6A, one or more sidewall spacers, such a second source side oxide spacer 619A, or a second drain side oxide spacer 619B, can be formed adjacent to a respective first source side oxide spacer 607A, or a first drain side oxide spacer 607B. In certain examples, the second oxide spacers 619A-B can be formed by growing, reacting, or depositing an oxide layer on the semiconductor device 600, and then etching back the oxide to leave the spacers 619A-B or one or more other specified oxide features, such as a drain oxide layer 627.

In certain examples, a second portion 613 of the source region, or a drain region 633 can be formed in a semiconductor region 601, such as using one or more ion implantation or diffusion steps. In certain examples, the lateral location of the second portion 613 or the drain region 633 can be coincident with the lateral edge of an oxide feature, such as the second oxide spacer 619A or the drain oxide layer 627, respectively.

Figure 6B:
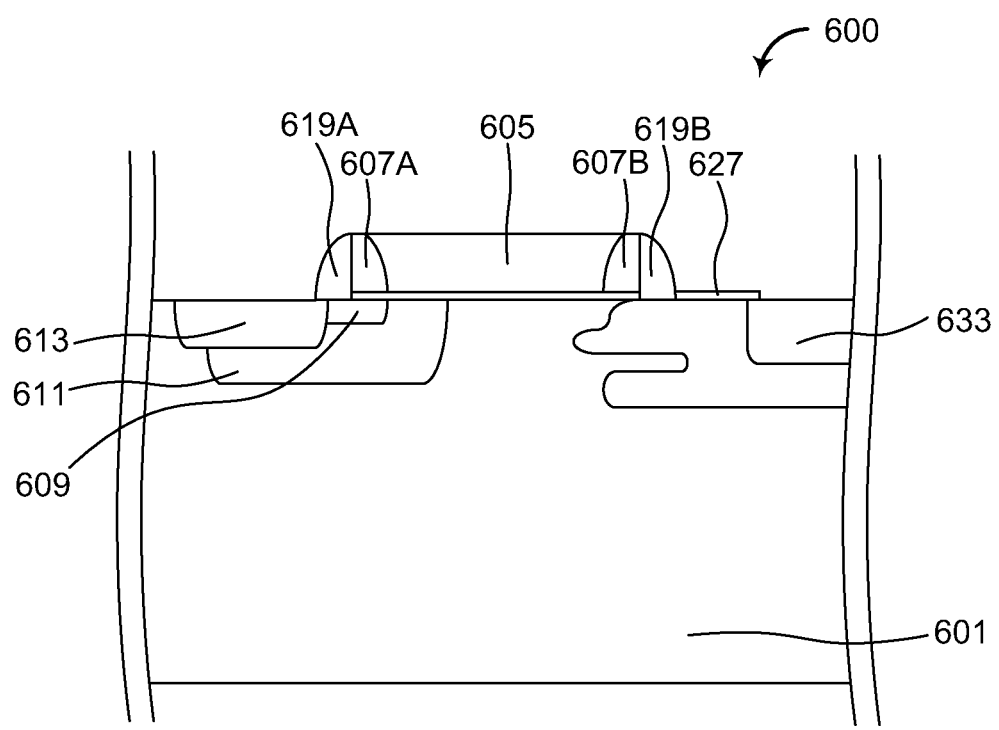

In an example, the lateral location of the second portion 613 can be determined at least in part during an ion implantation using the second oxide spacer 619A as a mask, or the lateral location of the drain region 633 is determined at least in part during an ion implantation using the drain oxide layer 627 as a mask. In this example, forming the second portion 613 or the drain region 633 can include thermal diffusion after ion implantation, such as shown in the examples of FIG. 6B, wherein the second portion 613 can be driven slightly under the second oxide spacer 619A or the drain region 633 can be driven slightly under the drain oxide 627. In an example of a PMOS device, the second portion 613 can include a heavily doped "p+" doping profile. In an example, the third portion 609 can include a peak doping concentration corresponding to (e.g., the same or about the same as) the second portion 613.

Figure 6C:
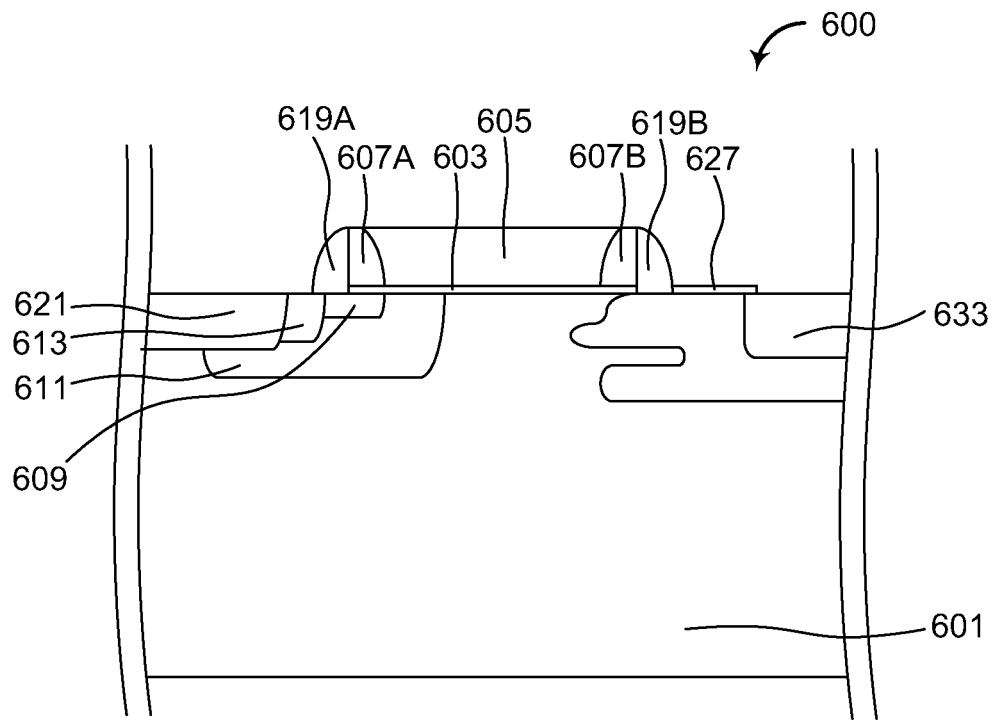

In the example of FIG. 6C, a first portion 621 can be formed in the semiconductor region 601, the first portion 621 having a heavily doped "n+" doping profile (e.g., a source "tap"), such as using one or more ion implantation or diffusion steps. In the example of FIG. 6C, the first portion 621 can be formed to penetrate into the semiconductor region 601 to a greater depth than both the second portion 613, and the third portion 609. In the example of FIG. 6C, the body portion 611 partially surrounds the first portion 621, the second portion 613, and the third portion 609, such as after forming the third portion 609 and the second portion 613 according to the examples of FIGS. 5A-5B, and after forming the first portion 621.

Figure 6D:
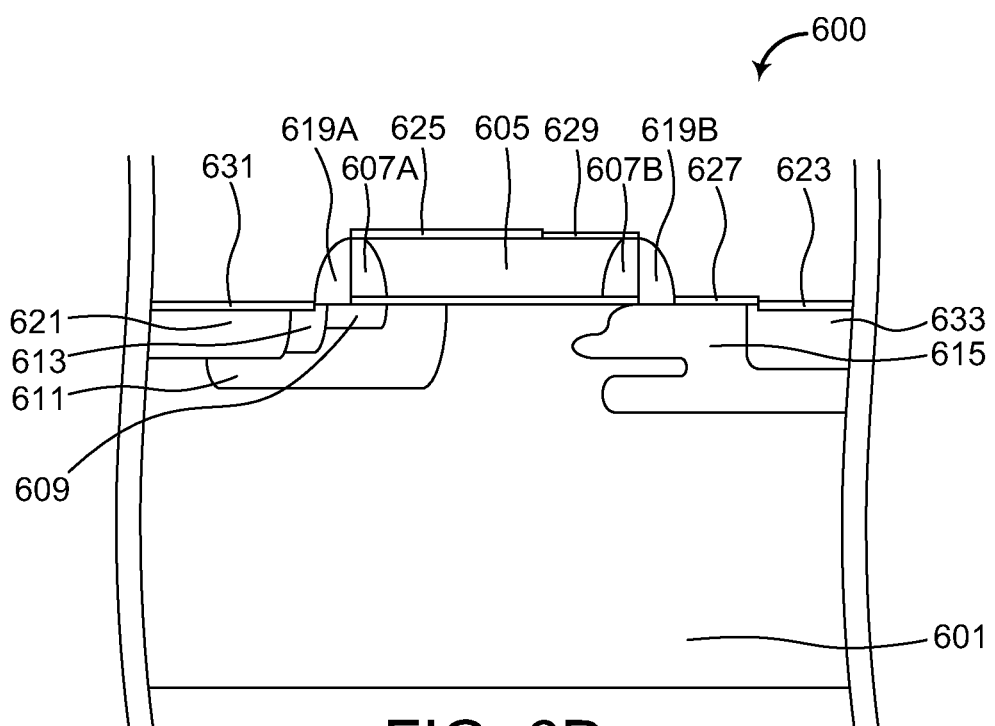

In the example of FIG. 6D, one or more oxides or electrical connections can be formed, such as to provide one or more connections between various portions of the semiconductor device 600, or to isolate various portions of the device 600. In the example of FIG. 6D, a source silicide layer 631 can be formed providing an electrical connection between the first portion 621 and the second portion 613. In this example, the source silicide layer 631 can be the source interconnect for the finished semiconductor device 600.

In an example, a gate silicide layer 625 can be formed on the gate polysilicon 605, such as to provide a gate interconnect for the finished semiconductor device 600. In an example, the remainder of the gate can be covered with an upper gate oxide later 629. In an example, a drain silicide layer 623 can be formed on the drain region 633, such as to provide a drain interconnect for the finished semiconductor device 600.

In certain examples, one or more silicide layers can be formed such as by first depositing a transition metal on one or more silicon regions of the semiconductor device 600. Then, a silicide-forming reaction occurs between the transition metal and one or more exposed regions of single crystal silicon or polysilicon, but not between oxide regions and the transition metal. Thus, in these examples, a self-aligned silicide layer, or "salicide" layer, is formed such as including the source silicide 631, the gate silicide 625, the drain silicide 623, or one or more other regions.

Simulation Results Including an Illustrative Example

FIG. 7 illustrates generally an illustrative example of an LDMOS semiconductor device 700 including different relative doping concentrations, such as the device 300 of FIG. 3. This illustrative example was produced using computer simulation of various processing steps such as those discussed above with respect to FIGS. 4A-4B, 5A-5B, and 6A-6D. In this illustrative example, more highly doped regions are shown as lighter (e.g. less shaded) than less highly doped regions. For reference, in this illustrative example, a source silicide layer 731, a gate 705, and a drain silicide layer 723 are indicated.

Additional Notes

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A semiconductor device, comprising:
   a semiconductor region including a first conductivity type having a first doping profile;
   a source region near a working top surface of the semiconductor region;
   a drain region near the working top surface and laterally offset from the source region;
   a gate located above the working top surface and located laterally between the source and drain regions; and
   a drift region located laterally between the gate and the drain region and at least partially overlapping with the gate and drain regions, the drift region comprising:
      a shallow portion extending laterally from the drain region toward the gate, the shallow portion comprising the second conductivity type having a peak doping concentration greater than an average drift region doping concentration; and
      a deep portion located at a greater depth within the semiconductor region than the shallow region, the deep portion comprising the second conductivity type having a peak doping concentration less than the average drift region doping concentration;
      wherein the deep portion extends laterally from the drain region toward the gate but not as far as the shallow portion; and
      wherein the shallow and deep portions are vertically separated along at least a portion of their overlapping width by a region of the first conductivity type in the lateral region extending from the gate toward the drain region.

2. The semiconductor device of claim 1, wherein the semiconductor region comprises a semiconductor substrate.

3. The semiconductor device of claim 1, wherein the first conductivity type is n type, and the second conductivity type is p type.

4. The semiconductor device of claim 1, comprising a body region near the working top surface;
   wherein the source region and the gate at least partially laterally overlap the body region near the working top surface;
   wherein the body region comprises the first conductivity type having a second doping profile; and
   wherein the source region comprises:
      a first portion having the first conductivity type having a third doping profile;
      a second portion having a second conductivity type having a fourth doping profile; and
      a third portion having the second conductivity type having a fifth doping profile;
      wherein the second portion is located laterally between the first and third portions and penetrates into the semiconductor region to a greater depth than the third portion but no more than the first portion; and
      wherein the lateral location of the third portion is determined at least in part using the lateral location of the gate.

5. The semiconductor device of claim 4, wherein the fourth doping profile corresponds to the fifth doping profile.

6. The semiconductor device of claim 4, wherein the third doping profile includes a third doping profile peak concentration greater than a second doping profile peak concentration.

7. The semiconductor device of claim 6, wherein the third doping profile is more highly doped with respect to the first doping profile and the second doping profile.

8. The semiconductor of claim 4, wherein the gate includes a polysilicon portion and a first oxide spacer at the lateral edge of the gate near the source region; and
   wherein the lateral location of the third portion of the source region is determined at least in part using the lateral location of the first oxide spacer.

9. The semiconductor device of claim 8, comprising a channel length of the gate along the working top surface that determined at least in part by the width of the first oxide spacer and the lateral location of the third portion of the source region.

10. The semiconductor device of claim 8, wherein the polysilicon portion includes a tapered portion and gets narrower near the working top surface of the semiconductor region.

11. The semiconductor device of claim 8, wherein the gate includes a second oxide spacer extending laterally from the first oxide spacer, and wherein the lateral location of the second portion of the source region is determined using the lateral location of the second oxide spacer.

12. The semiconductor device of claim 11, wherein a gate-to-source capacitance (Cgs) controlled at least in part using a lateral thickness of at least one of the first or second oxide spacers.

13. The semiconductor device of claim 11, comprising:
   a first silicide region above the first and second portions of the source region; and
   a second suicide region on top of the gate;
   wherein a lateral location of the first silicide region is determined using the second oxide spacer.

14. The semiconductor device of claim 4, wherein the body region at least partially surrounds the first, second, and third portions of the source region.

15. The semiconductor device of claim 14, wherein the body region penetrates into the semiconductor region to a depth greater than the first, second, and third portions.

16. The semiconductor device of claim 1, comprising a well region having the first conductivity type within a semiconductor substrate having the second conductivity type.

17. The semiconductor device of claim 1, wherein the drain region includes the second conductivity type having a sixth doping profile; and
   wherein a peak doping concentration of the sixth doping profile is greater than a peak doping concentration of a drift region doping profile.

18. The semiconductor device of claim 1, wherein the gate includes a polysilicon portion and a first oxide spacer at the lateral edge of the gate;
   wherein the lateral location of an upper portion of the shallow portion of the drift region near the first oxide spacer is determined at least in part by the location of the first oxide spacer; and
   wherein the shallow portion includes a lower portion extending further under the lateral edge of the gate than the upper portion.

19. A semiconductor device, comprising:
   a semiconductor region including a first conductivity type having a first doping profile;
   a source region near a working top surface of the semiconductor region;
   a drain region near the working top surface and laterally offset from the source region;
   a body region near the working top surface, the body region comprising the first conductivity type having a second doping profile;
   a gate located above the working top surface and located laterally between the source and drain regions, the gate including a polysilicon portion and a first oxide spacer at a lateral edge of the gate; and
   a drift region located laterally between the gate and the drain region and at least partially overlapping with the gate and drain regions, the drift region comprising:
      a shallow portion extending laterally from the drain region toward the gate, the shallow portion comprising the second conductivity type having a peak doping concentration greater than an average drift region doping concentration; and
      a deep portion located at a greater depth within the semiconductor region than the shallow region, the deep portion comprising the second conductivity type having a peak doping concentration less than the average drift region doping concentration;
      wherein the deep portion extends laterally from the drain region toward the gate but not as far as the shallow portion; and
      wherein the shallow and deep portions are vertically separated along at least a portion of their overlapping width by a region of the first conductivity type in the lateral region extending from the gate toward the drain region;
   wherein the source region and the gate at least partially laterally overlap the body region near the working top surface;
   wherein the lateral location of an upper portion of the shallow portion of the drift region near the first oxide spacer is determined at least in part by the location of the first oxide spacer; and
   wherein the shallow portion includes a lower portion extending further under the lateral edge of the gate than the upper portion.

20. The semiconductor device of claim 19, wherein the source region comprises:

a first portion having the first conductivity type having a third doping profile;
a second portion having a second conductivity type having a fourth doping profile; and
a third portion having the second conductivity type having a fifth doping profile;
wherein the second portion is located laterally between the first and third portions and penetrates into the semiconductor region to a greater depth than the third portion but no more than the first portion;
wherein the lateral location of the third portion is determined at least in part using the lateral location of the gate;
wherein the body region at least partially surrounds the first, second, and third portions of the source region; and
wherein the body region penetrates into the semiconductor region to a depth greater than the first, second, and third portions.

* * * * *